(12) United States Patent
Daneman et al.

(10) Patent No.: US 10,683,205 B2
(45) Date of Patent: Jun. 16, 2020

(54) RELEASE CHEMICAL PROTECTION FOR INTEGRATED COMPLEMENTARY METAL-OXIDE-SEMICONDUCTOR (CMOS) AND MICRO-ELECTRO-MECHANICAL (MEMS) DEVICES

(71) Applicant: INVENSENSE, INC., San Jose, CA (US)

(72) Inventors: Michael J. Daneman, Campbell, CA (US); Fariborz Assaderaghi, Emerald Hills, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 16/101,353

(22) Filed: Aug. 10, 2018

(65) Prior Publication Data
US 2018/0346323 A1    Dec. 6, 2018

Related U.S. Application Data

(62) Division of application No. 15/281,589, filed on Sep. 30, 2016, now Pat. No. 10,071,906, which is a
(Continued)

(51) Int. Cl.
*B81C 1/00*       (2006.01)
*B81B 7/00*       (2006.01)

(52) U.S. Cl.
CPC .......... *B81C 1/00246* (2013.01); *B81B 7/007* (2013.01); *B81B 7/0025* (2013.01);
(Continued)

(58) Field of Classification Search
CPC ....... H01L 24/02–09; H01L 2924/1461; H01L 2224/031; H01L 2224/0312; B81B 7/007; B81C 1/00246
See application file for complete search history.

(56) References Cited

U.S. PATENT DOCUMENTS 4,822,753 A    4/1989  Pintchovski et al.
6,661,084 B1   12/2003 Peterson et al.
(Continued)

FOREIGN PATENT DOCUMENTS

CN    101077767 A    11/2007
CN    101423187 A    5/2009
CN    102222629 A    10/2011

OTHER PUBLICATIONS

Witvrouw, et al. "Comparison between wet HF etching and vapor HF etching for sacrificial oxide removal". Proc. SPIE 4174, Micromachining and Microfabrication Process Technology VI, 130, Aug. 25, 2000. 12 pages.
(Continued)

*Primary Examiner* — Tucker J Wright
(74) *Attorney, Agent, or Firm* — Amin, Turocy & Watson, LLP

(57) ABSTRACT

Systems and methods that protect CMOS layers from exposure to a release chemical are provided. The release chemical is utilized to release a micro-electro-mechanical (MEMS) device integrated with the CMOS wafer. Sidewalls of passivation openings created in a complementary metal-oxide-semiconductor (CMOS) wafer expose a dielectric layer of the CMOS wafer that can be damaged on contact with the release chemical. In one aspect, to protect the CMOS wafer and prevent exposure of the dielectric layer, the sidewalls of the passivation openings can be covered with a metal barrier layer that is resistant to the release chemical. Additionally, or optionally, an insulating barrier layer can be deposited on the surface of the CMOS wafer to protect a passivation layer from exposure to the release chemical.

16 Claims, 9 Drawing Sheets

Related U.S. Application Data division of application No. 14/477,451, filed on Sep. 4, 2014, now Pat. No. 9,487,396.

(52) U.S. Cl.
CPC ...... *B81C 1/00531* (2013.01); *B81C 1/00539* (2013.01); *B81C 1/00801* (2013.01); *B81B 2207/015* (2013.01); *B81C 2201/0132* (2013.01); *B81C 2201/0133* (2013.01); *B81C 2201/053* (2013.01); *B81C 2203/0735* (2013.01)

(56) References Cited

U.S. PATENT DOCUMENTS

| | | |
|---|---|---|
| 2002/0132472 A1 | 9/2002 | Park |
| 2006/0151880 A1 | 7/2006 | Tang et al. |
| 2007/0281381 A1 | 12/2007 | Ayazi |
| 2011/0117747 A1 | 5/2011 | Wey et al. |
| 2012/0261830 A1 | 10/2012 | Chu et al. |
| 2015/0158716 A1 | 6/2015 | Cheng et al. |

OTHER PUBLICATIONS

Wang, Qing-Ming. "Lecture 10: Surface micromachining-1" University of Pittsburgh, CourseME2080—Introduction to Microelectromechanical Systems, published online at http://www.pitt.edu/~qiw4/Academic/ME2080/lecture10.pdf. Retrieved Oct. 21, 2014, 34 pages.

SPTS Technologies. "Introduction to HF Vapour Etch". Published online at [http://www.spts.com/banners/hf-intro]. Retrieved Oct. 21, 2014, 2 pages.

Bakke, et al. "Etch Stop Materials for Release by Vapor HF Etching" 16th MicroMechanics Europe Workshop, Goteborg, Sweden, 2005, 4 pages.

European Search Report dated Feb. 12, 2016 for European Patent Application No. 15183869.5, 6 pages.

Non-Final Office Action for U.S. Appl. No. 14/477,451 dated Aug. 14, 2015, 18 pages.

"Final Office Action for U.S. Appl. No. 14/477,451 dated Dec. 22, 2015, 22 pages."

Final Office Action for U.S. Appl. No. 14/477,451 dated Apr. 20, 2016, 23 pages.

Chinese Office Action dated Aug. 22, 2016 for Chinese Application Serial No. 201510562928.3, 8 pages.

Chinese Office Action dated May 12, 2017 for Chinese Application Serial No. 201510562928.3, 18 pages.

Chinese Office Action dated Nov. 27, 2017 for Chinese Application Serial No. 201510562928.3, 18 pages.

Non-Office Action for U.S. Appl. No. 15/281,589 dated Aug. 14, 2017, 41 pages.

Final Office Action for U.S. Appl. No. 15/281,589 dated Dec. 21, 2017, 41 pages.

Taiwan Office Action dated Dec. 22, 2018 for Taiwan Patent Application No. 104129131, 25 pages (with translation).

Chinese Office Action dated Mar. 11, 2019 for Chinese Patent Application No. 201510562928.3, 26 pages (with translation).

Chinese Office Action dated Nov. 1, 2019 for Chinese Patent Application No. 201510562928.3, 16 pages (with translation).

RELEASE CHEMICAL PROTECTION FOR INTEGRATED COMPLEMENTARY METAL-OXIDE-SEMICONDUCTOR (CMOS) AND MICRO-ELECTRO-MECHANICAL (MEMS) DEVICES

CROSS REFERENCE TO RELATED APPLICATION

This application is a divisional of, and claims priority to, U.S. patent application Ser. No. 15/281,589, entitled "RELEASE CHEMICAL PROTECTION FOR INTEGRATED COMPLEMENTARY METAL-OXIDE-SEMICONDUCTOR (CMOS) AND MICRO-ELECTRO-MECHANICAL (MEMS) DEVICES," filed on Sep. 30, 2016, which is a divisional of, and claims priority to, U.S. patent application Ser. No. 14/477,451, entitled "RELEASE CHEMICAL PROTECTION FOR INTEGRATED COMPLEMENTARY METAL-OXIDE-SEMICONDUCTOR (CMOS) AND MICRO-ELECTRO-MECHANICAL (MEMS) DEVICES," filed on Sep. 4, 2014. The entireties of each of the above-referenced U.S. Patent Applications is hereby incorporated herein by reference.

TECHNICAL FIELD

The subject disclosure relates to integrated complementary metal-oxide-semiconductor (CMOS) and micro-electro-mechanical (MEMS) devices, e.g., to release chemical protection for the integrated CMOS-MEMS devices.

BACKGROUND

Micro-Electro-Mechanical Systems (MEMS) is a widely used technology that enables integration of both microelectronic circuits and mechanical structures on the same chip, while significantly lowering fabrication costs and chip size. Oftentimes, a surface micromachining technique is utilized to fabricate MEMS devices, wherein structural parts of the device are combined with layers of a sacrificial material. The sacrificial material is then removed by employing a chemical etchant that does not react with the structural material, leaving behind movable structural parts. Typically, MEMS processes using sacrificial oxides are well suited to produce fragile structures such as thin membranes or low stiffness mechanical devices by mechanically supporting such devices during the fabrication process and releasing the sacrificial layers as a last step in the process. The most widely used surface micromachining techniques use Silicon dioxide ($SiO_2$) as the sacrificial material Hydrofluoric acid (HF) as the chemical etchant.

For MEMS structures that are integrated with a CMOS wafer, the CMOS wafer is susceptible to damage due to the exposure to the hydrofluoric acid (HF) based chemical etchant during MEMS release. Moreover, a conventional CMOS wafer contains silicon oxide in its inter-metal dielectrics and passivation stack, which etches rapidly on exposure to HF. Specifically, passivation openings on the CMOS wafer that are utilized to expose metal pads for bonding the CMOS wafer to the MEMS structure, expose the wafer's silicon oxide, making the wafer unsuitable for HF exposure during fabrication of integrated CMOS-MEMS devices.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

The systems and methods described herein, in one or more embodiments thereof, relate to an integrated complementary metal-oxide-semiconductor (CMOS) and micro-electro-mechanical (MEMS) device that prevents damage to the CMOS layers during the release of the MEMS structure. In one aspect, the system relates to an integrated circuit substrate (e.g., CMOS layers) comprising a passivation opening having a sidewall that exposes a dielectric layer of the integrated circuit substrate. Further, a metallic barrier layer is deposited on the sidewall that prohibits exposure of the dielectric layer to a release chemical employable to release the MEMS structure integrated with the integrated circuit substrate.

An aspect of the disclosed subject matter relates to a method that comprises creating an opening in a passivation layer of an integrated circuit substrate, wherein a sidewall of the opening exposes a dielectric layer of the integrated circuit substrate. Further, the method comprises depositing a metal layer on the sidewall to protect the dielectric layer from a release chemical employable to release a MEMS device integrated with the integrated circuit substrate. Further, yet another aspect of the disclosed subject matter relates to an integrated CMOS-MEMS device comprising a CMOS wafer and a MEMS device that is integrated with the CMOS wafer. Moreover, the MEMS device comprises a sacrificial layer that is removable by utilization of a release chemical. Further, the CMOS wafer comprises a passivation layer with an opening having a sidewall that exposes a dielectric layer of the CMOS wafer and a barrier material comprising a metal resistant to the release chemical that covers the sidewall.

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

The numerous aspects, embodiments, objects and advantages of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
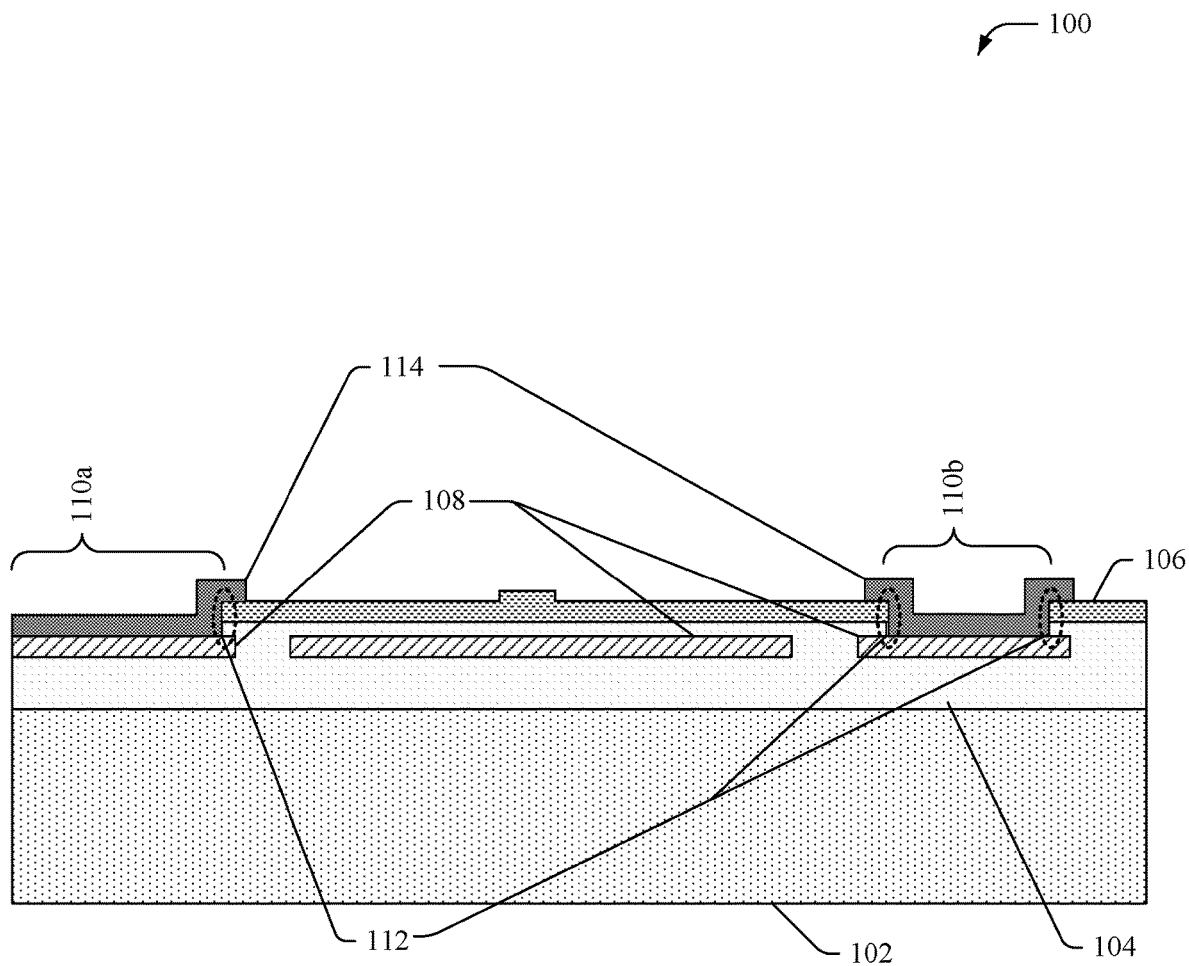
FIG. 1 illustrates example complementary metal-oxide-semiconductor (CMOS) wafer that is resistant to a release chemical.

One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details, e.g., without applying to any particular networked environment or standard. In other instances, well-known structures and devices are shown in block diagram form in order to facilitate describing the embodiments in additional detail.

Systems and methods disclosed herein, in one or more aspects provide release chemical protection for integrated complementary metal-oxide-semiconductor (CMOS) and micro-electro-mechanical (MEMS) devices. The subject matter is described with reference to the drawings, wherein like reference numerals are used to refer to like elements throughout. In the following description, for purposes of explanation, numerous specific details are set forth in order to provide a thorough understanding of the subject innovation. However, that the subject matter may be practiced without these specific details.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. In addition, the word "coupled" is used herein to mean direct or indirect electrical or mechanical coupling. In addition, the words "example" and/or "exemplary" are used herein to mean serving as an example, instance, or illustration. Any aspect or design described herein as "example" and/or "exemplary" is not necessarily to be construed as preferred or advantageous over other aspects or designs. Rather, use of the word exemplary is intended to present concepts in a concrete fashion.

Initially, referring to FIG. 1, there illustrated is an example complementary metal-oxide-semiconductor (CMOS) wafer 100 that is resistant to a release chemical. In one example, the CMOS wafer 100 can be utilized for various applications, such as but not limited to, audio sensors, wireless devices, industrial systems, automotive systems, robotics, telecommunications, security, medical devices, etc. Typically, the CMOS wafer 100 comprises a substrate 102, a dielectric layer 104 (e.g., silicon oxide ($SiO_2$)), a passivation layer 106 (e.g., Silicon Nitride), and metal pads 108. As an example, the passivation layer 106 comprises thin-film coatings (e.g., of Silicon Nitride) that can be deposited on the layers of the CMOS wafer 100 using plasma enhanced chemical vapor deposition (PECVD). The passivation layer 106 protects the CMOS layers from moisture and/or external contamination, enables heat dissipation, increases wear resistance and/or increases electrical insulation. Oftentimes, passivation openings (110a, 110b) are created within the passivation layer 106, for example, to expose the metal pads 108 for bonding to a micro-electro-mechanical (MEMS) device (not shown) via eutectic bonds, metal compression bonds, fusion bonds, anodic bonds, copper-to-copper bonds, etc. In another example, passivation openings (110a, 110b) can be created within the passivation layer 106 to expose a wire-bond pad to facilitate packaging the CMOS wafer 100 and/or to expose probe pads. The dielectric layer 104 is exposed through sidewalls (vertical façade) 112 of the passivation openings (110a, 110b). If the CMOS wafer 100 is exposed to a release chemical (e.g., Hydrofluoric acid) utilized for a release etch of MEMS structures from sacrificial layer (not shown), the release chemical can react with the dielectric layer 104, leading to substantial damage to the CMOS wafer 100.

In one aspect, to protect the dielectric layer 104 from exposure to the release chemical, a primary barrier layer 114 can be deposited to cover the sidewalls 112. Moreover, the primary barrier layer 114 can comprise one or more metals that are resistant to the specific release chemical. For example, if Hydrofluoric acid (HF) is to be utilized as a release chemical, metals, such as, but not limited to, Titanium, Titanium Nitride, Aluminum, or Aluminum-Copper, etc. that are resistant to HF can be utilized. In an aspect, the primary barrier layer 114 can be non-brittle and/or flexible so that it does not crack, for example, under mechanical and/or thermal stresses that can be applied during processing. Various processes can be utilized to deposit the primary barrier layer 114, for example, but not limited to, sputtering, evaporation, plasma-enhanced chemical vapor deposition (PECVD), low pressure chemical vapor deposition (CVD), atomic layer deposition, etc. The thickness of the primary barrier layer 114 can vary based on the properties of the metal utilized and is typically thick enough not to be porous. For example, if the metal utilized slowly erodes when exposed to the release chemical (e.g., the metal is not completely resistant to the release chemical but has a slow etch rate), the thickness of the primary barrier layer 114 should be sufficient to survive the release process and not completely erode. Generally, the thickness of the primary barrier layer 114 can range from (but is not limited to) 100 angstrom to 5 micron.

Figure 2:
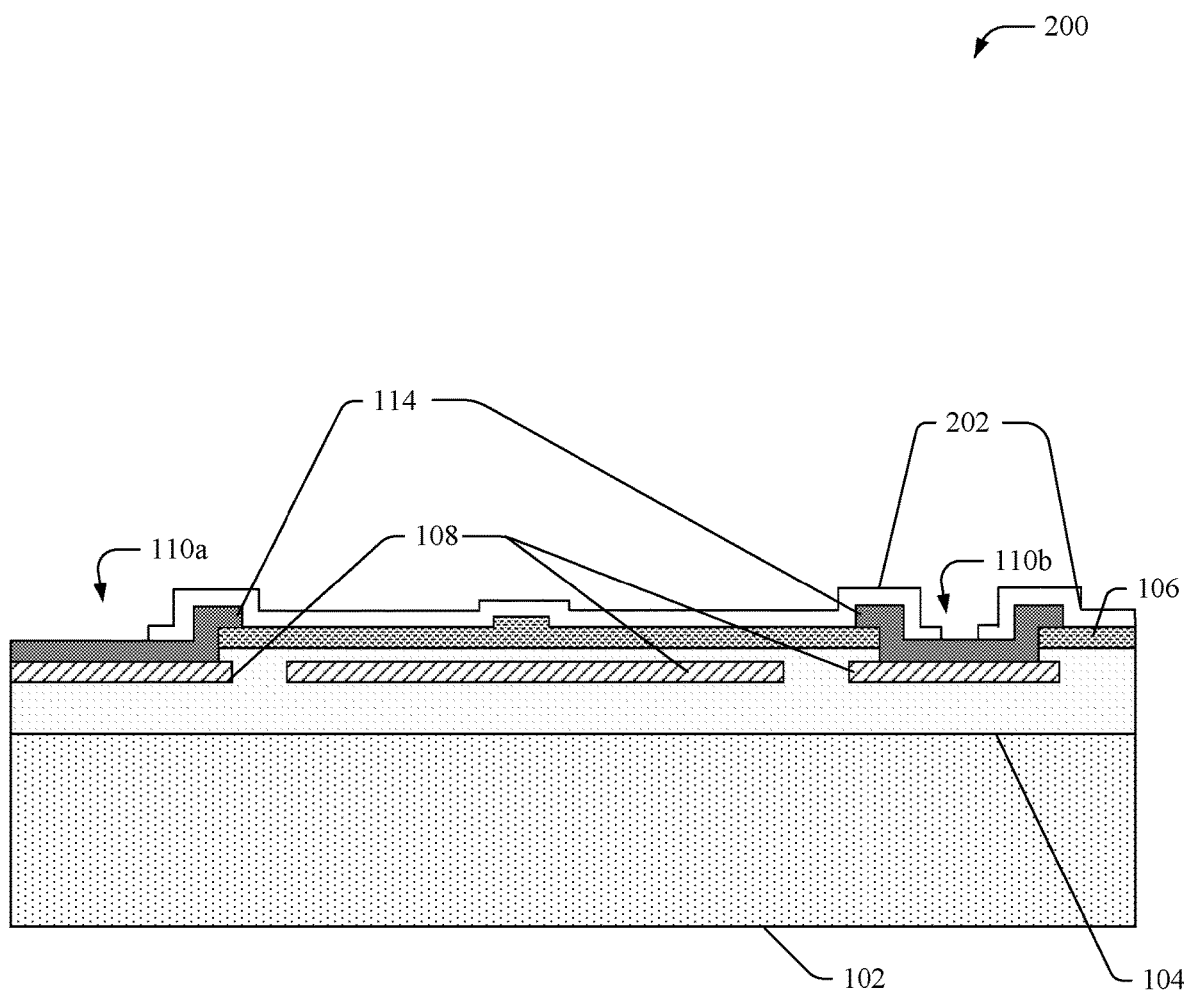
FIG. 2 illustrates an example CMOS wafer comprising a passivation layer that is protected from exposure to a release chemical.

FIG. 2 illustrates an example CMOS wafer 200 comprising a passivation layer 106 that is protected from exposure to a release chemical. In one aspect, a secondary barrier layer 202 can be deposited on the passivation layer 106 for protection from/resistance against a release chemical (e.g., HF). It is noted that the substrate 102, dielectric layer 104, passivation layer 106, metal pads 108, passivation openings (110a, 110b), and the primary barrier layer 114 can include functionality, as more fully described with respect to device 100.

In one aspect, the secondary barrier layer 202 is an insulating layer that blankets over majority of the wafer 200. As an example, the secondary barrier layer 202 can include, but is not limited to a dielectric material that is resistant (or partially resistant) to the release chemical. The secondary barrier layer 202 can have most any step coverage and is not required to be robust against cracking over the passivation openings (110a, 110b). Thus, a wide variety of insulating materials can be utilized. In one aspect, various processes can be utilized to deposit the secondary barrier layer 202, for example, but not limited to, sputtering, evaporation, PECVD, low pressure CVD, enhanced CVD, atomic layer deposition, etc. The thickness of the secondary barrier layer 202 can vary based on the properties of the dielectric utilized and is typically thick enough not to be porous. For example, if the dielectric utilized slowly erodes when exposed to the release chemical (e.g., the dielectric is not completely resistant to the release chemical but has a slow etch rate), the thickness of the secondary barrier layer 202 can be made sufficient to survive the release process and not completely erode. In one aspect, the secondary barrier layer 202 is an optional layer. For example, the secondary barrier layer 202 may not be used if the passivation layer 106 is resistant to the release chemical.

Figure 3A:
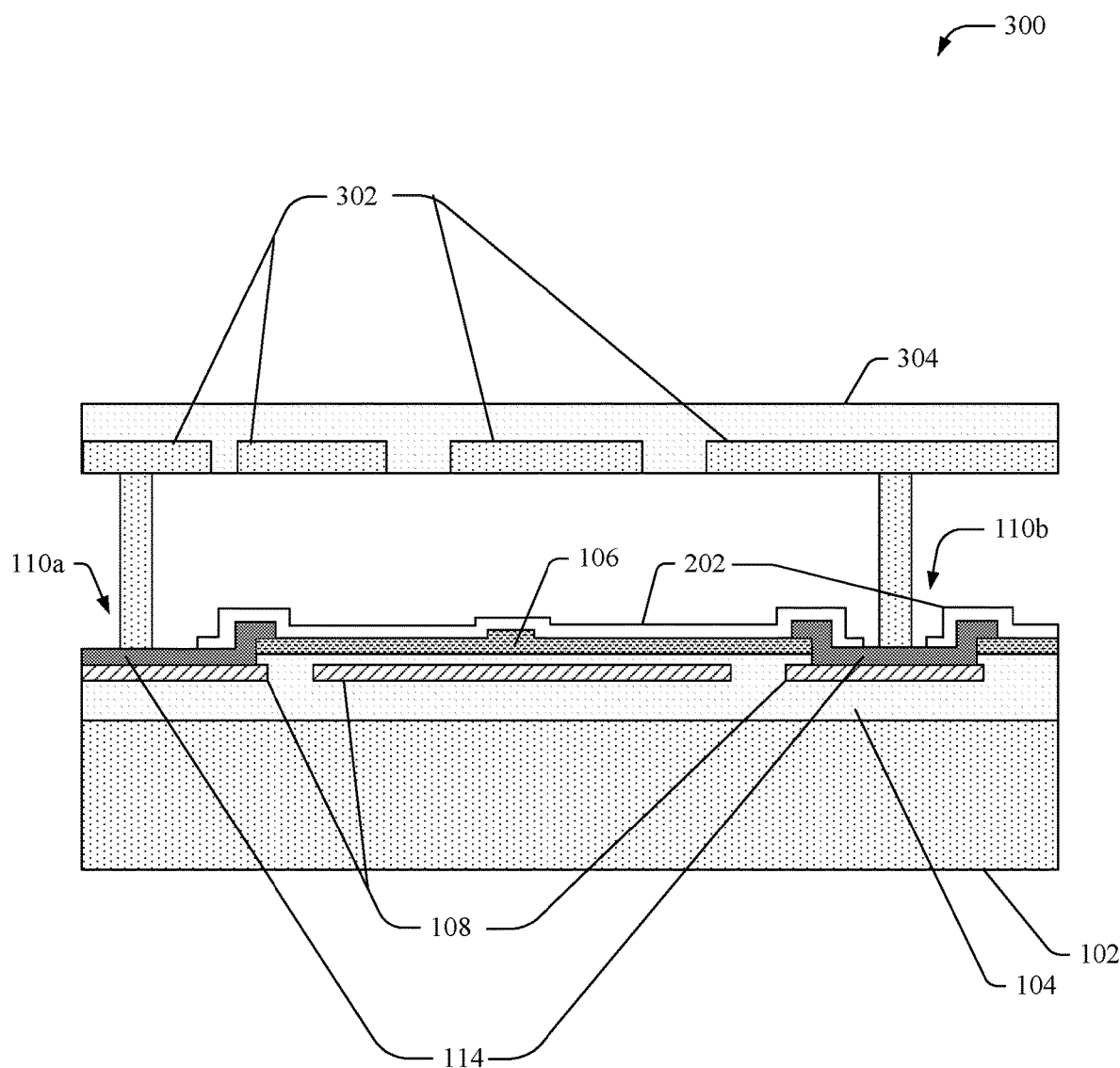
FIGS. 3A and 3B illustrate an example integrated CMOS and micro-electro-mechanical (MEMS) device during different stages of fabrication.
Figure 3B:
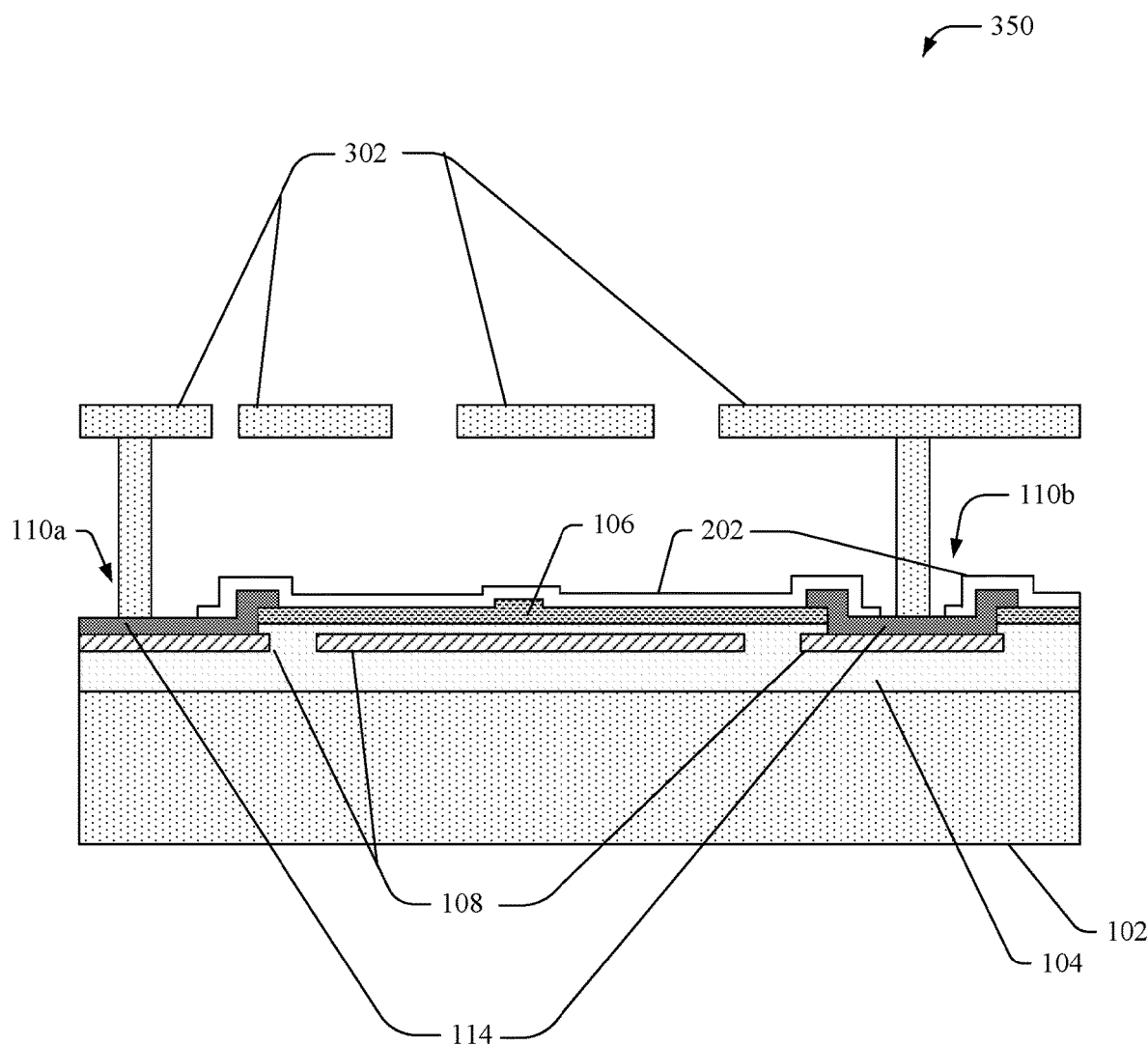

FIGS. 3A and 3B illustrate an example integrated CMOS-MEMS device during different stages of fabrication, according to an aspect of the specification. In one aspect, CMOS-MEMS integration can improve the performance of the MEMS structure 302 and allow for smaller packages, leading to lower packaging and/or instrumentation costs. MEMS processes utilize sacrificial layers 304 to produce fragile MEMS structures 302 (e.g., movable structures) such as, but not limited to, thin membranes or low stiffness mechanical devices. Moreover, the sacrificial layers 304 mechanically support such MEMS structures 302 during the fabrication process, after which the sacrificial layers 304 are released by using a release chemical as a last step in the process. However, integrating such structures 302 with CMOS at wafer level is challenging since CMOS layers cannot typically survive exposure to the release chemicals. To integrate the MEMS structures 302 with the CMOS layers, passivation openings (110a, 100b) can be created to expose metals pads 108 that can be bonded to the MEMS structure 302 (e.g., via eutectic bonds). The creation of the passivation openings (110a, 100b) exposes the dielectric layer 104 of the CMOS (via the sidewalls). Moreover, the release chemical can react with the dielectric layer 104 of the CMOS and cause substantial damage to the CMOS structure.

According to an aspect, to prevent exposure of the dielectric layer 104 to the release chemical, the vulnerable passivation openings (110a, 110b) can be covered (completely or partially) with the primary barrier layer 114 (and optionally the vulnerable passivation layer 106 can be covered with the secondary barrier layer 202). Accordingly, the CMOS-MEMS device can be made robust to the MEMS release chemistry allowing fabrication of the integrated CMOS-MEMS device using sacrificial oxide structures. It is noted that the substrate 102, dielectric layer 104, passivation layer 106, metal pads 108, passivation openings (110a, 110b), the primary barrier layer 114, and secondary barrier layer can include functionality, as more fully described with respect to devices 100 and 200.

Referring now to FIG. 3A, there depicted is an example integrated CMOS-MEMS device 300 prior to the MEMS release process. As an example, the MEMS structure can comprise poly-Si or poly-SiGe and the sacrificial layer 304 can comprise a silicon oxide layer ($SiO_2$). The sacrificial layer 304 can be removed by exposing the integrated CMOS-MEMS device 300 to a release chemical such as, but not limited to liquid HF and/or vapor HF (VHF). In one example, if a wet chemical etching process is to be performed, mixture of liquid HF and water or a mixture of buffered HF with glycerol can be utilized as the release chemical. Typically, when the released wet etched structures dry, stiction problems can arise that are avoided if a dry chemical etching process is performed by utilizing VHF.

FIG. 3B depicts an example integrated CMOS-MEMS device 350 after the MEMS release process. Moreover, when the CMOS-MEMS device 300 is exposed to the release chemical, the sacrificial layer 304 is removed, leaving behind the CMOS-MEMS device 350. In one aspect, the primary barrier layer 114 protects the dielectric layer 104 and prevents exposure of the dielectric layer 104 to the release chemical through the sidewalls of the passivation openings (110a, 110b). Additionally (or optionally), the secondary barrier layer 202 protects the passivation layer 106 and prevents exposure of the passivation layer 106 to the release chemical. Accordingly, the release chemical does not damage the CMOS layers. It is noted that the primary barrier layer 114 and the secondary barrier layer 202 can be resistant to the release chemical and/or can react with the release chemical with a slow etch rate. Moreover, the primary barrier layer 114 can comprise most any metal resistant (e.g., partially or completely) to the release chemical while the secondary barrier layer 202 can comprise most any dielectric material resistant (e.g., partially or completely) to the release chemical.

Figure 4A:
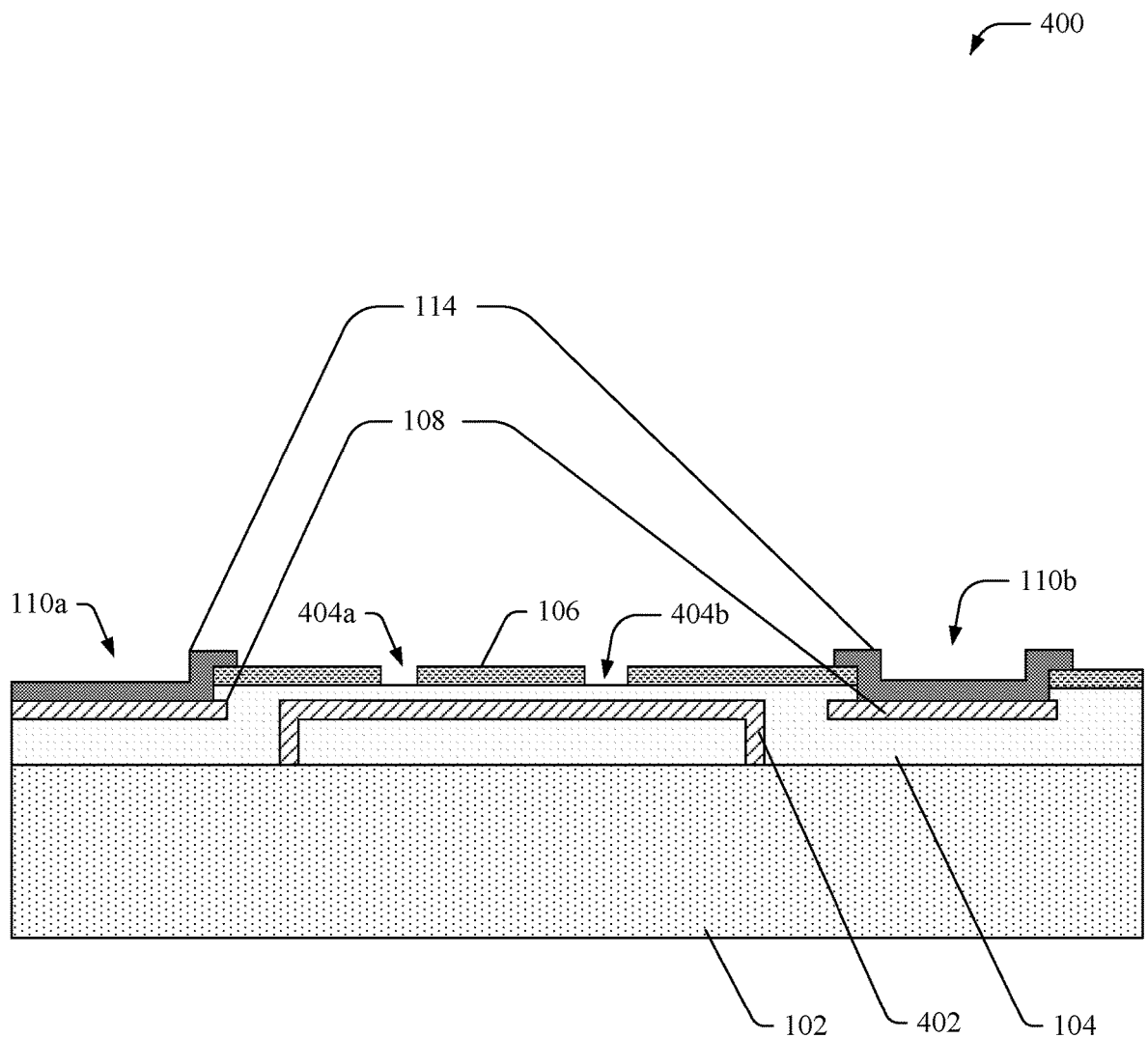
FIGS. 4A and 4B illustrate an example MEMS structure integrated within a metallization stack of a CMOS device during different stages of fabrication.
Figure 4B:
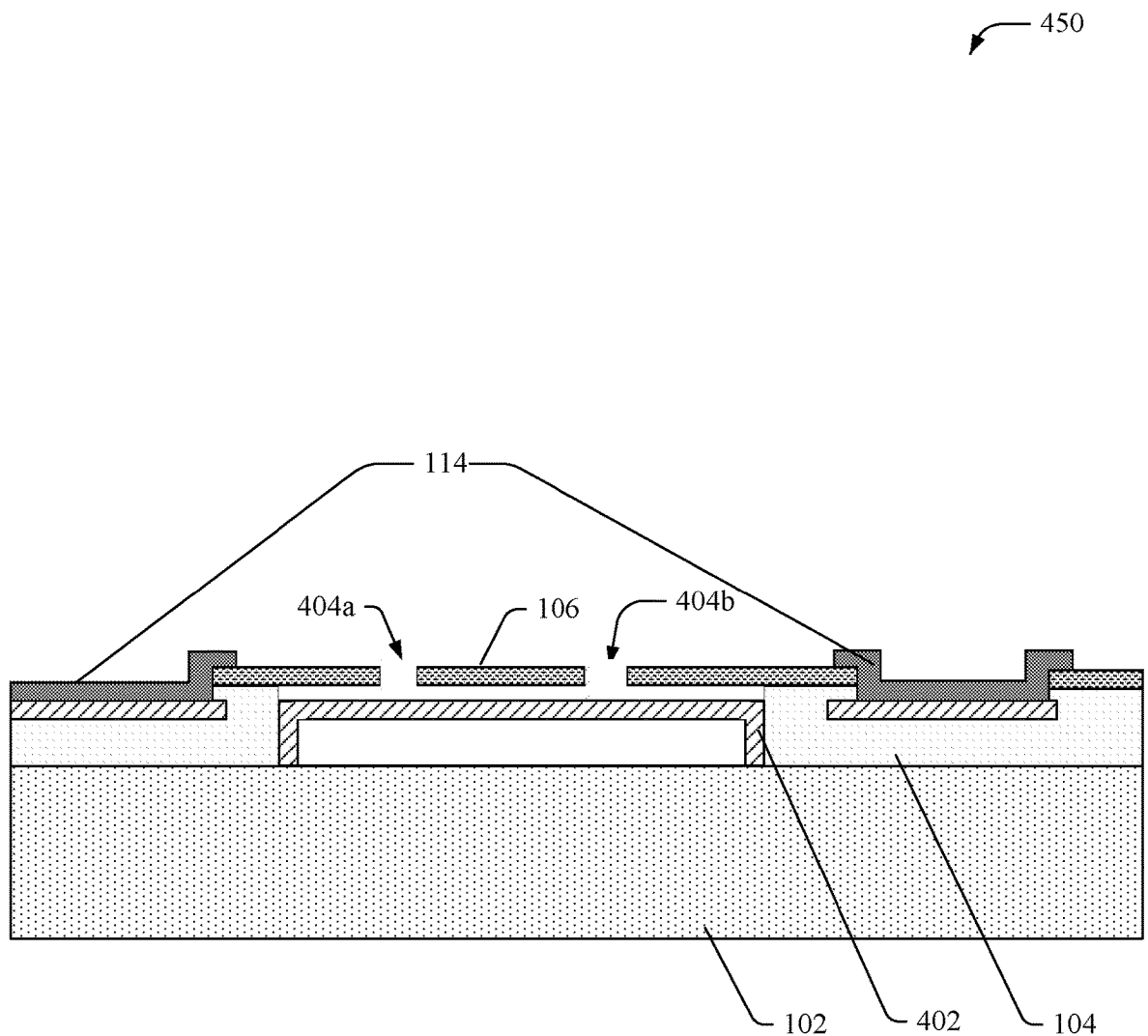

Referring now to FIGS. 4A and 4B, there illustrated is an example MEMS structure integrated within a metallization stack of a CMOS device (400, 450) during different stages of fabrication, according to an aspect of the specification. According to an aspect, the MEMS structure 402 can be created from CMOS metal layers (or combination of metal and dielectric layers) of a CMOS wafer. Typically, after CMOS wafer fabrication, the MEMS structure 402 can be released by exposing the CMOS device 400 to VHF passed through the release holes (404a, 404b) formed in the passivation layer 106. It is noted that the substrate 102, dielectric layer 104, passivation layer 106, metal pads 108, passivation openings (110a, 110b), and the primary barrier layer 114, can include functionality, as more fully described with respect to devices 100-350. Although not depicted in FIGS. 4A and 4B, the passivation layer 106 can be covered with and protected by a secondary barrier layer (e.g., secondary barrier layer 202).

In one example scenario, passivation openings (110a, 110b) can be created after the release to the MEMS structure 402 to prevent exposure of the dielectric layer 104 through the sidewalls of the passivation openings (110a, 110b). In this scenario, after the MEMS release, the release holes (404a, 404b) are sealed by depositing another layer over the release holes (404a, 404b) before the metal pads 108 can be exposed. However, if the MEMS structure 402 needs to be exposed to the environment (e.g., in the case of a pressure, chemical, and/or acoustic sensors), the metal pads 108 cannot be opened after the release due to the risk of damaging the MEMS structure 402 through the release holes (404a, 404b). Accordingly, to enable opening of metal pads 108 prior to the MEMS release, the primary barrier layer 114 can be deposited over at least a portion of the passivation openings (110a, 110b) such that the sidewalls that expose the dielectric layer 104 are covered by the primary barrier layer 114. As an example, the primary barrier layer 114 can comprise most any metal or combination of metals resistant (e.g., partially or completely) to VHF.

FIG. 4A depicts an example MEMS structure 402 integrated within a CMOS device 400 prior to the MEMS release process. Release holes (404a, 404b) are created within the passivation layer 106 and VHF is passed through the release holes (404a, 404b) to etch the MEMS structure 402. The dielectric layer 104 exposed through the sidewalls of the passivation openings (110a, 110b) is protected from the VHF by the primary barrier layer 114. FIG. 4B depicts an example MEMS structure 402 integrated within a CMOS device 450 after the MEMS release process. Moreover, on exposure to the release chemical, the sacrificial material (e.g., portion of the dielectric layer 104) is removed, leaving behind the released MEMS structure 402. Accordingly, the release chemical does not damage the CMOS layers. It is noted that the primary barrier layer 114 (and/or the secondary barrier layer 202) can be resistant to the release chemical and/or can react with the release chemical with a slow etch rate.

Figure 5:
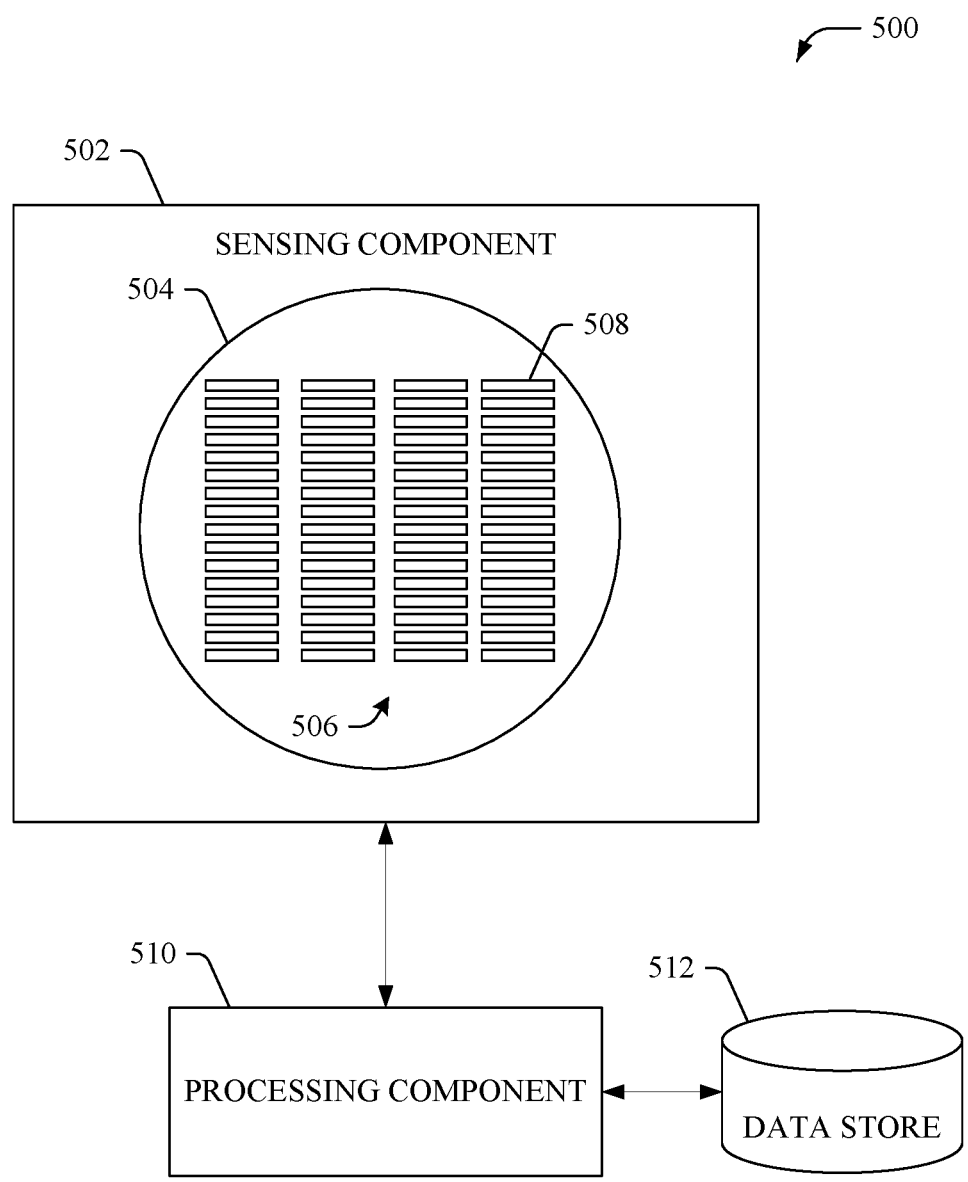
FIG. 5 illustrates an example system utilized for sensing an acoustic signal.

FIG. 5 illustrates an example system 500 utilized for sensing an acoustic signal in accordance with an aspect of the subject disclosure. System 500 depicts one example application of the integrated CMOS-MEMS device disclosed herein. However, it is noted that the subject specification is not limited to microphone/sensor applications and aspects disclosed herein can be utilized in various integrated circuits utilized for different applications. In one aspect, system 500 can be utilized in various applications, such as, but not limited to, communication devices, medical applications, security systems, biometric systems (e.g., fingerprint sensors and/or motion/gesture recognition sensors), industrial automation systems, consumer electronic devices, robotics, etc. In one aspect, system 500 can include a sensing component 502 that can facilitate acoustic sensing. Moreover, the sensing component 502 can include a silicon wafer 504 having a two-dimensional (or one-dimensional) array 506 of acoustic sensors 508, for example, integrated CMOS-MEMS devices 350 and/or 450. As an example, the acoustic sensor 508 can comprise thin MEMS membranes (302, 402) that are supported by sacrificial layers (304, 104) during fabrication. At the end of the fabrication process, the sacrificial layers (304, 104) are removed by exposure to a release chemical (e.g., HF, VHF). During the removal process, the CMOS layers exposed through a sidewall of a passivation opening are protected by utilizing a primary barrier layer 114 that covers the sidewall. Additionally, or optionally, the passivation layer 106 of the CMOS is protected from the release chemical by utilizing a secondary barrier layer 202 that covers a top surface of the passivation layer 106.

The MEMS membrane (302, 402) vibrates based on the incoming acoustic signal and a change in capacitance due to the movement of the MEMS membrane (302, 402) can be utilized to generate a corresponding electrical signal. A processing component 510 can further process the electrical signal. For example, the electrical signal can be digitized and stored in a data store 512. In another example, the electrical signal can be transmitted to another device and/or played back via a speaker.

It is noted that the processing component 510 and/or the data store 512 can be locally and/or remotely coupled to the sensing component 502 via most any wired and/or wireless communication network. Further, it is noted that the processing component 510 can include one or more processors configured to confer at least in part the functionality of system 500. To that end, the one or more processors can execute code instructions stored in memory, for example, volatile memory and/or nonvolatile memory. By way of illustration, and not limitation, nonvolatile memory can include read only memory (ROM), programmable ROM (PROM), electrically programmable ROM (EPROM), electrically erasable PROM (EEPROM), or flash memory. Volatile memory can include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory (e.g., data stores, databases) of the subject systems and methods is intended to comprise, without being limited to, these and any other suitable types of memory.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

It is noted that the design of devices 100-450 and/or system 500 can include different material selections, topologies, etc., to achieve efficient protection of CMOS layers during a release of a MEMS structure of an integrated CMOS-MEMS device. Moreover, it is noted that the devices 100-450 and/or system 500 can include most any components and circuitry elements of any suitable value in order to implement the embodiments of the subject innovation. Further, it is noted that the devices 100-450 can include fewer or greater number of layers and/or designs for each layer. Furthermore, it can be appreciated that the components of devices 100-450 and/or system 500 can be implemented on one or more integrated circuit (IC) chips.

Figure 6:
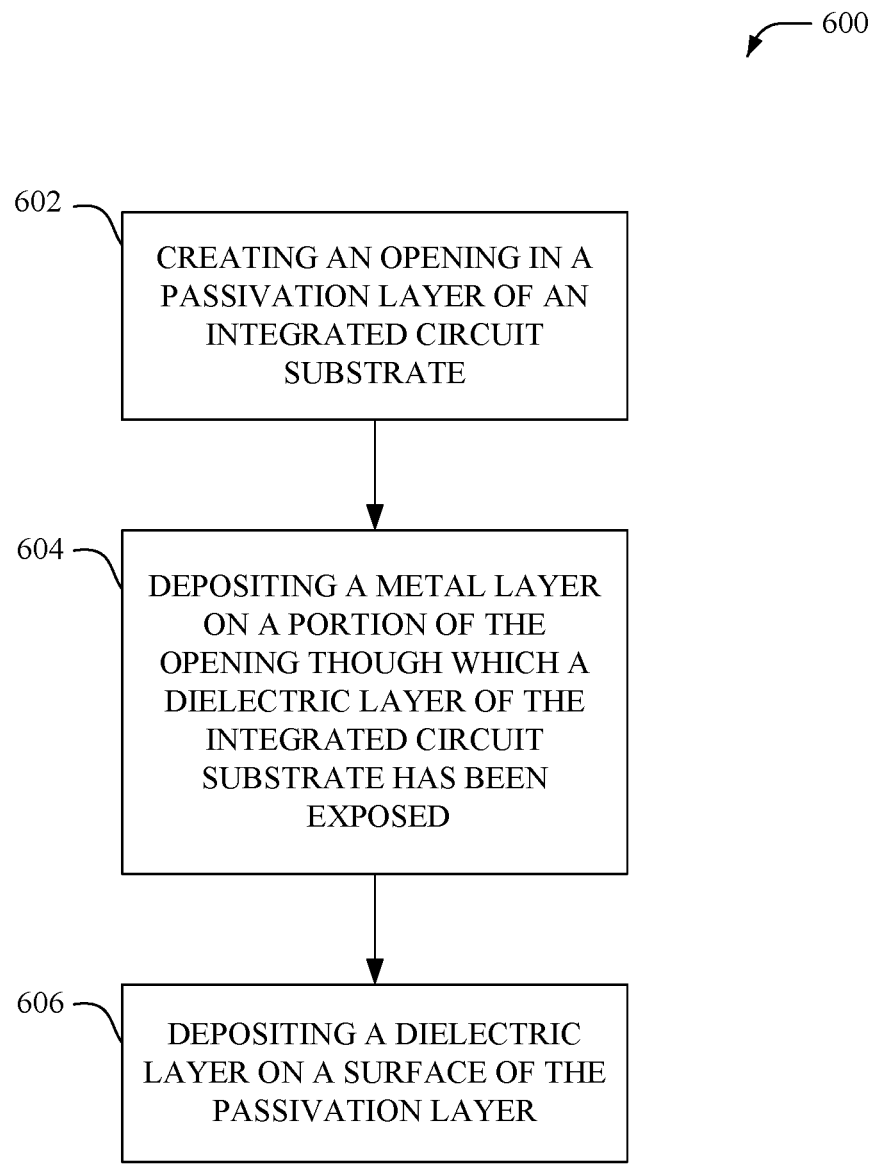
FIG. 6 illustrates an example methodology for depositing protective layers within an integrated CMOS-MEMS device.
Figure 7:
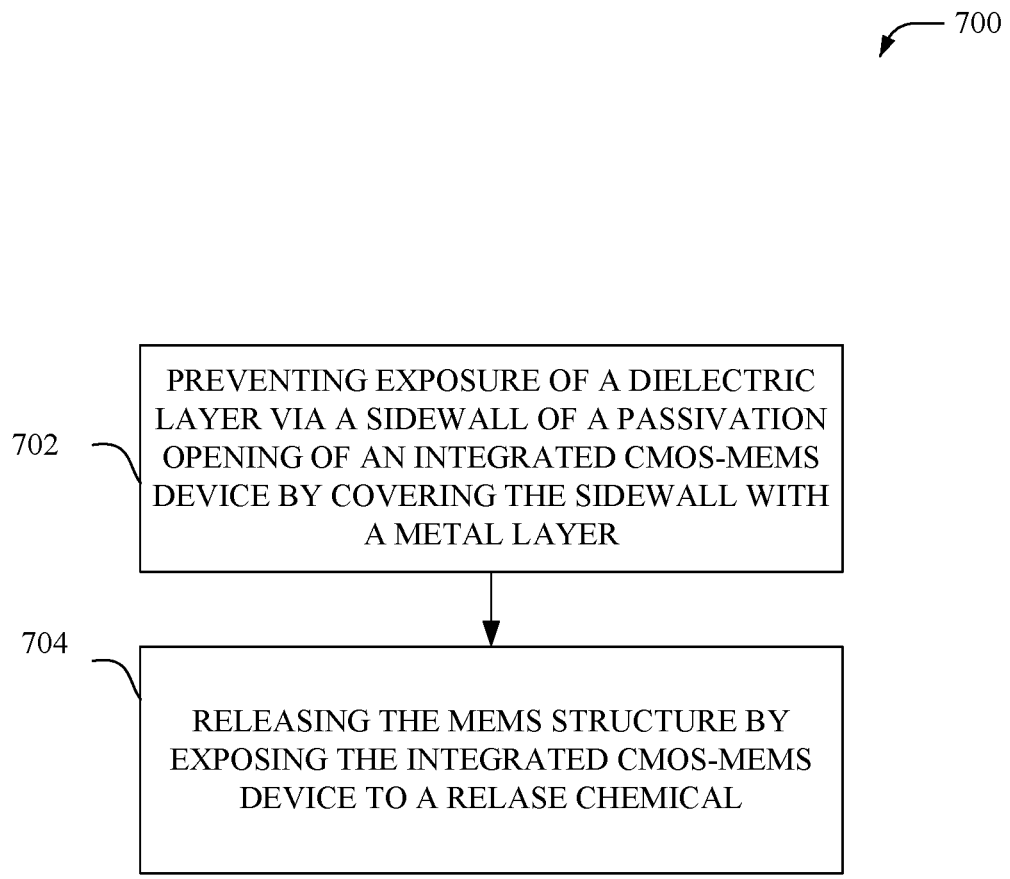
FIG. 7 illustrates an example methodology for protecting a dielectric layer of an integrated CMOS-MEMS device.

FIGS. 6-7 illustrate methodologies and/or flow diagrams in accordance with the disclosed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the disclosed subject matter. In addition, the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device or computer-readable storage/communications media.

FIG. 6 illustrates an example methodology 600 for depositing protective layers within an integrated CMOS-MEMS device in accordance with an aspect of the subject disclosure. Specifically, methodology 600 enables release of a MEMS structure without damage to the CMOS wafer during fabrication. At 602, an opening can be created within a passivation layer of an integrated circuit substrate (e.g., CMOS wafer). As an example, the passivation layer can comprise thin-film coatings (e.g., of Silicon Nitride) that can be deposited on the layers of the integrated circuit substrate during a passivation process (e.g., using PECVD). The passivation layer protects the integrated circuit substrate from moisture and/or external contamination, enables heat dissipation, increases wear resistance and/or increases electrical insulation. In one aspect, the passivation opening can be created within the passivation layer, for example, to expose a metal pad of the integrated circuit substrate during bonding to a MEMS device (e.g., via eutectic bonds, metal compression bonds, fusion bonds, anodic bonds, copper-to-copper bonds, etc.), to expose a probe pad, and/or to expose a wire-bond pad to facilitate packaging, etc.

At 604, a metal layer can be deposited over a portion of the opening though which a dielectric layer (e.g., oxide layer) of the integrated circuit substrate has been exposed. For example, the metal layer can be deposited over the entire opening and then patterned to leave the metal layer only over a sidewall (e.g., vertical façade) of the opening that exposes the dielectric layer. Moreover, the metal layer can be deposited by various deposition processes, such as, but not limited to, sputtering, evaporation, atomic layer deposition, enhanced CVD, and/or low-pressure CVD, etc. In one aspect, the metal layer can comprise most any metal or combination or metals that are non-brittle and/or flexible to avoid cracking on the corners of the opening (e.g., under mechanical and/or thermal stresses that can be applied during processing), such as, but not limited to, Aluminum, Aluminum-Copper, Titanium, and/or Titanium nitride, etc. In addition, the metal or combination or metals can be resistant (or partially resistant) to a release chemical utilized to release a MEMS structure integrated with the integrated circuit substrate.

At 606, a dielectric layer can be deposited on a surface of the passivation layer. The dielectric layer can be an insulating layer that covers majority of the CMOS wafer to prohibit the release chemical from reacting with the CMOS wafer. As an example, the dielectric layer can include most any dielectric material that is resistant (or partially resistant) to the release chemical. In one aspect, various processes can be utilized to deposit the dielectric layer, for example, but not limited to, sputtering, evaporation, PECVD, low pressure CVD, atomic layer deposition, etc. According to an aspect, the thickness of the metal layer and/or the dielectric layer can vary based on the properties of the materials utilized and is typically thick enough not to be porous. For example, if the material utilized slowly erodes when exposed to the release chemical, the thickness of the metal layer and/or the dielectric layer is kept thick enough to survive the release process and not completely erode. In one aspect, the dielectric layer is an optional layer that can be utilized, for example, if the passivation layer is not resistant to the release chemical.

FIG. 7 illustrates an example methodology 700 for protecting a dielectric layer of an integrated CMOS-MEMS device in accordance with an aspect of the subject disclosure. At 702, exposure of the dielectric layer via a sidewall of a passivation opening of the integrated CMOS-MEMS device can be prevented by covering the sidewall with a metal layer. As an example, the metal layer can be deposited by various deposition processes, such as, but not limited to, sputtering, evaporation, atomic layer deposition, enhanced CVD, and/or low-pressure CVD, etc. In one aspect, the metal layer can comprise most any metal or combination or metals that are resistant (or partially resistant) to a release chemical utilized to release a MEMS structure of the CMOS-MEMS device. As an example, the metal layer can comprise Aluminum, Aluminum-Copper, Titanium, and/or Titanium nitride, etc.

At 704, the MEMS structure can be released by exposing the CMOS-MEMS device to a release chemical (e.g., HF, VHF, etc.). The release chemical removes sacrificial layers, leaving behind a movable MEMS structure. In one aspect, the metal layer protects the dielectric layer and prevents exposure of the dielectric layer to the release chemical through the sidewalls of the passivation openings. Accordingly, the release chemical does not damage the CMOS layers.

What has been described above includes examples of the subject disclosure. It is, of course, not possible to describe every conceivable combination of components or methodologies for purposes of describing the subject matter, but it is to be appreciated that many further combinations and permutations of the subject disclosure are possible. Accordingly, the claimed subject matter is intended to embrace all such alterations, modifications, and variations that fall within the spirit and scope of the appended claims.

In particular and in regard to the various functions performed by the above described components, devices, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter.

The aforementioned systems and/or components have been described with respect to interaction between several components. It can be appreciated that such systems and/or components can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it should be noted that one or more components may be combined into a single component providing aggregate functionality or divided into several separate sub-components, and any one or more middle layers, may be provided to communicatively couple to such sub-components in order to provide integrated functionality. Any components described herein may also interact with one or more other components not specifically described herein.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. An integrated device, comprising:
a complementary metal-oxide-semiconductor (CMOS) wafer; and
a micro-electro-mechanical (MEMS) device integrated with the CMOS wafer, wherein the MEMS device comprises sacrificial layer that is removable by utilization of a release chemical, wherein the release chemical comprises hydrofluoric acid, and wherein the CMOS wafer comprises a passivation layer with an opening having a sidewall that exposes a dielectric layer of the CMOS wafer and a barrier material, comprising a metal resistant to the release chemical, that covers the sidewall, wherein the passivation and the dielectric layer are distinct layers comprising different materials, wherein the barrier material is a first barrier material wherein a second barrier layer is provided over at least a portion of the first barrier material, and wherein the metal comprises Aluminum.

2. The integrated device of claim 1, wherein the barrier material is formed by depositing the metal on the integrated circuit substrate and patterning the metal to leave a portion of the metal that forms the barrier layer on the sidewall.

3. The integrated device of claim 2, wherein the depositing comprises depositing the barrier material based on sputtering.

4. The integrated device of claim 2, wherein the depositing comprises depositing the barrier material based on evaporation.

5. The integrated device of claim 2, wherein the depositing comprises depositing the barrier material based on atomic layer deposition.

6. The integrated device of claim 2, wherein the depositing comprises depositing the barrier material based on plasma enhanced chemical vapor deposition.

7. The integrated device of claim 2, wherein the depositing comprises depositing the barrier material based on a low pressure chemical vapor deposition process.

8. The integrated device of claim 1, wherein the release chemical comprises vapor-phase hydrofluoric acid.

9. The integrated device of claim 1, wherein the release chemical comprises liquid-phase hydrofluoric acid.

10. The integrated device of claim 1, wherein the second barrier material comprises an insulator.

11. The integrated device of claim 1, wherein the second barrier material comprises a dielectric material.

12. An integrated device, comprising:
a complementary metal-oxide-semiconductor (CMOS) wafer; and
a micro-electro-mechanical (MEMS) device integrated with the CMOS wafer, wherein the MEMS device comprises sacrificial layer that is removable by utilization of a release chemical, wherein the release chemical comprises hydrofluoric acid, and wherein the CMOS wafer comprises a passivation layer with an opening having a sidewall that exposes a dielectric layer of the CMOS wafer and a barrier material, comprising a metal resistant to the release chemical, that covers the sidewall, wherein the passivation and the dielectric layer are distinct layers comprising different materials, wherein the barrier material is a first barrier material, wherein a second barrier layer is provided over at least a portion of the first barrier material, and wherein the second barrier material comprises an insulator.

13. The integrated device of claim 12, wherein the barrier material is formed by depositing the metal on an integrated circuit substrate and patterning the metal to leave a portion of the metal that forms the barrier layer on the sidewall.

14. The integrated device of claim 13, wherein the depositing comprises depositing the barrier material based on at least one of sputtering, evaporation, atomic layer deposition or plasma enhanced chemical vapor deposition.

15. The integrated device of claim 13, wherein the depositing comprises depositing the barrier material based on a low pressure chemical vapor deposition process.

16. The integrated device of claim 12, wherein the release chemical comprises at least one of vapor-phase hydrofluoric acid or liquid-phase hydrofluoric acid.

\* \* \* \* \*